HOUSING FOR DISC-SHAPED SEMICONDUCTOR DEVICE

Filed April 11, 1968

United States Patent Office 3,499,095
Reissued Mar. 3, 1970

3,499,095

HOUSING FOR DISC-SHAPED SEMICONDUCTOR DEVICE

Joachim Haus, Ebermannstadt, Germany, assignor to Siemens Aktiengesellschaft, a corporation of Germany Continuation-in-part of application Ser. No. 499,198, Oct. 21, 1965. This application Apr. 11, 1968, Ser. No. 729,862
Claims priority, application Germany, Jan. 30, 1965, S 95,262
Int. Cl. H05k *5/02*
U.S. Cl. 174—52 8 Claims

ABSTRACT OF THE DISCLOSURE

A housing structure for a disc-shaped semiconductor device comprises a hollow cylindrical section of insulation material in which the semiconductor device is mounted. A first end member is affixed to one open end of the cylindrical section and closes it and a second end member is affixed to the other open end of the cylindrical section and closes it. Each of the first and second end members comprises a central portion and an outer portion of annular configuration having an inner rim affixed to the central portion. Each central portion comprises a metal of good thermal and electrical conductivity, such as copper or silver, and each outer position has a thickness considerably less than that of the central portion as well as a fluted annular section formed in the outer portion at its inner rim.

DESCRIPTION OF THE INVENTION

The present application is a continuation-in-part application of my application Ser. No. 499,198, filed Oct. 21, 1965, now abandoned, for Housing for Disc-Shaped Semiconductor Device.

The present invention relates to a housing for a disc-shaped semiconductor device. More particularly, the invention relates to a flat housing structure for protecting a disc-shaped semiconductor device from thermal stresses and the like.

A semiconductor rectifier or thyristor of disc shape such as, for example, a silicon rectifier or a silicon thyristor may be enclosed in a flat housing. The housing is a hollow cylindrical section or ring of insulation material such as, for example, ceramic material, which is closed at both its open or base ends with foil of a ductile metal having good current and heat conducting characteristics. The foil may comprise silver, copper or the like, affixed to the cylindrical section at its bases and covering the open ends thereof. The semiconductor device is held in position between the foils and comprises a disc-shaped semiconductor body of silicon, for example, and an aluminum foil alloyed with the semiconductor body at one surface of the body. A metal carrier body of molybdenum, for example, is joined with the aluminum foil and has a thermal coefficient of expansion similar to that of the semiconductor body. A large area electrode of a noble metal may be alloyed to the semiconductor body at the opposite surface of said body. If the semiconductor device is a thyristor, an additional or control electrode may be alloyed to the semiconductor body. A second molybdenum carrier body having a suitable thermal coefficient of expansion may be joined to the large area electrode. The second carrier body is silver plated on its surface closer to the semiconductor body and has a recess formed therein to insulate the control electrode therefrom, if a control electrode is utilized. The noble metal surfaces of the semiconductor and carrier bodies are tightly joined by the application of heat at suitable temperatures. The semiconductor device may be positioned in a frame tightly enclosed in the housing.

Large semiconductor devices are housed under pressure between large cooling bodies, which may be cooled by liquid or suitable cooling fluid, in order to dissipate the heat resulting from operation of such devices. Since the cooling bodies contact the metal foils at substantially planar surfaces, the cylindrical section is substantially freely movable. Thus, an outside force component, in the direction of the axis of the cylindrical section, which has a sufficiently large magnitude, would tear the metal foils in their rim areas. Rather complicated supporting and centering devices are thus required for the semiconductor device. In a large semiconductor device the forces and pressures on the metal foils are greater than in small devices. These forces and pressures result from temperature changes which occur during operation and are due to the various different thermal coefficients of expansion. The temperature changes occurring during operation produce stresses in the solder connections of the silver foils with the ceramic ring as well as in the silver foils themselves.

The principal object of the present invention is to provide a new and improved housing structure for a disc-shaped semiconductor device.

An object of the present invention is to provide a housing structure for protecting a disc-shaped semiconductor device from damage due to external forces.

In accordance with the present invention, a housing structure for a disc-shaped semiconductor device comprises a substantially cylindrical section of insulation material which is hollow and which has spaced opposite open end bases. A first end member is affixed to one open end base of the cylindrical section and closes the one open end thereof. The first end member comprises a first central portion of substantially thick disc configuration and a first outer portion of substantially annular configuration having an inner rim affixed to the first central portion. The first central portion comprises copper or silver. The first outer portion comprises an iron-cobalt-nickel alloy and has a thickness considerably less than the thickness of the first central portion. A fluted annular section is formed in the first outer portion at its inner rim. A second end member is affixed to the other open end base of the cylindrical section and closes the other open end thereof. The second end member comprises a second central portion of substantially thick disc configuration and a second outer portion of substantially annular configuration having an inner rim affixed to the second central portion. The second central portion comprises copper or silver. The second outer portion comprises an iron-cobalt-nickel alloy and has a thickness considerably less than the thickness of the second central portion. A fluted annular section is formed in the second outer portion at its inner rim. A disc-shaped semiconductor device is mounted in the cylindrical section between the first and second end members.

Each of the first and second outer portions may comprise one of the metals nickel, copper or silver.

In an illustrated embodiment of the present invention, each of the first and second central portions has good electrical and heat conducting characteristics and each of the first and second outer portions has a thermal coefficient of expansion similar to that of the cylindrical section. Each of the first and second central portions has a first principal surface substantially adjacent the semiconductor device, a second principal surface spaced from and substantially parallel to the first principal surface, a substantially annular mid-surface, a substantially cylindrical step surface substantially perpendicular to and joining the first and mid-surfaces and a substantially cylindrical outer peripheral surface substantially perpendicular to and joining the second and mid-surfaces.

In the illustrated embodiment of the present invention, an annular groove is formed in the mid-surface of each of the first and second central portions. The inner rim of the fluted annular section of the first outer portion is fastened in the annular groove formed in the mid-surface of the first central portion and the inner rim of the fluted annular section of the second outer portion is fastened in the annular groove formed in the midsurface of the second central portion.

In order that the present invention may be readily carried into effect, it will now be described with reference to the accompanying drawing, wherein.

A silicon semiconductor body 2 of disc shape is assumed to have a diameter of 3.0 cm. and the diameters of the other components of the semiconductor device and of the housing structure are illustrated in substantially their proportion to said semiconductor body. The thicknesses of some of the components are greatly exaggerated in order to maintain the clarity of illustration.

Figure 1:
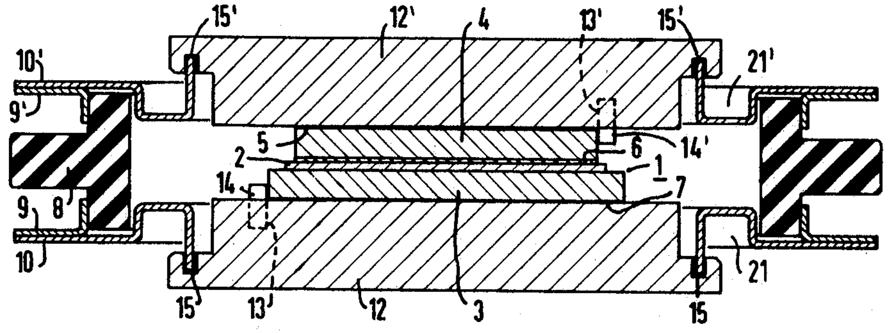
FIG. 1 is a sectional view of an embodiment of the housing structure of the present invention housing a disc-shaped semiconductor rectifier.

The housing structure of FIG. 1 comprises a hollow cylinder 8 of insulation material such as, for example, ceramic material. An end member is affixed to the lower open end or base surface of the cylinder or ring 8 and an identical end member is affixed to the upper open end or base surface of the cylinder or ring 8. The end members are coaxially positioned with the cylinder 8 and each of said end members comprises a central portion 12 of substantially thick disc configuration and an outer portion 10 of substantially annular configuration.

The central portion 12 of each of said end members comprises good electrical and heat conducting material such as, for example, copper, silver, or the like, and the outer portion 10 of each of said end members is of a material having a thermal coefficient of expansion similar to that of the ceramic material such as, for example, nickel, copper, silver, or an iron-cobalt-nickel alloy. The upper end member and its components and parts are identified by the same reference numerals as the lower end member and its components and parts, primed.

A semiconductor device 1 of disc shape is positioned between the end members 12, 10 and 12′, 10′ and comprises a silicon disc or semiconductor body 2 having a diameter of approximately 3.0 cm. and a thickness of approximately 300 microns. An aluminum electrode (not shown) is alloyed to the lower surface of the semiconductor body 2 and a first disc-shaped carrier body or plate 3 is affixed to the aluminum electrode by heating. The first carrier body 3 comprises molybdenum, tungsten, or the like. A gold-antimony electrode (not shown) is alloyed to the upper surface of the semiconductor body 2. A silver foil 6 is positioned on the upper surface of the gold-antimony electrode and a second disc-shaped carrier body or plate 4 is positioned on the upper surface of the silver foil 6. The second carrier body 4 comprises molybdenum, tungsten, or the like. The lower surface of the second carrier plate 4 may be plated with the silver foil 6 and said carrier plate may then be affixed to the gold-antimony electrode by heating. Either or both of the first and second carrier bodies may be silver plated.

The semiconductor device 1 is positioned between the central portions 12 and 12′ of the end members. The upper central portion 12′ is stepped or gradated down in a down step which is substantially perpendicular to the principal surface areas thereof, said down step being substantially parallel in cross section with and coaxially and concentrically positioned with the outer peripheral surface of said central portion. The central portion 12′ thus comprises a substantially planar, substantially circular upper surface, a substantially planar, substantially circular lower surface, a substantially planar annular lower mid-surface, a substantially cylindrical step surface perpendicular to and joining the lower and lower mid-surfaces, and a substantially cylindrical outer peripheral surface perpendicular to and joining the lower mid- and upper surfaces.

The upper and lower central portions 12′ and 12, respectively, of the upper and lower end members are stepped or graduated toward each other. Thus, the lower central portion 12 is stepped or gradated up in an up step which is substantially perpendicular to the principal surface areas thereof, said up step being substantially parallel in cross section with and coaxially and concentrically positioned with the outer peripheral surface of said central portion. The central portion 12 thus comprises a substantially planar, substantially circular lower surface, a substantially planar, substantially circular upper surface, a substantially planar annular upper mid-surface, a substantially cylindrical step surface perpendicular to and joining the upper and upper mid-surfaces, a substantially cylindrical outer peripheral surface perpendicular to and joining the upper mid- and upper surfaces.

An annular groove or channel 15′ is formed in the lower mid-surface of the upper central portion 12′ and has solder therein. An annular groove or channel 15 is formed in the upper mid-surface of the lower central portion 12 and has solder therein. A substantially annular member or washer 10′ is coaxially affixed to the upper central portion 12′ by having a portion thereof inserted into the channel 15′ and hard soldered therein. A substantially annular member or washer 10 is coaxially affixed to the lower central portion 12 by having a portion thereof inserted into the channel 15 and hard soldered therein. Each of the annular members 10 and 10′ comprises a material having a thermal coefficient of expansion corresponding to that of the ceramic ring 8 such as, for example, an iron-cobalt-nickel alloy.

The upper anl lower central portions 12′ and 12 may each have a thickness, in the direction of the axis, of, for example, 8 mm. between the upper and lower surfaces, whereas the upper and lower annular members 10′ and 10 may each have a thickness, in the direction of the axis, of, for example, 0.5 mm. The upper and lower annular members 10′ and 10 are substantially identical. A fluted annular section, channel or groove 21′ is formed in the upper annular member 10′ at its inner rim, opening upward. A fluted annular section, channel or groove 21 is formed in the lower annular member 10 at its inner rim, opening downward. The innermost rim of each of the upper and lower annular members, which is the cylindrical inner portion of each of said members and of the annular channel 21′ and 21, respectively, thereof, is inserted into the corresponding annular channel 15′ and 15, respectively, of the upper and lower central portions 12′ and 12, respectively, and hard soldered therein. These solder connections are only slightly stressed by radially directed forces.

An upper annular member or washer 9′ of substantially L-shaped cross-sectional area is affixed by suitable means such as hard solder to the upper portion of the outer cylindrical surface of the ceramic ring 8 and to the lower outside rim area surface of the upper annular member 10′ by suitable means such as welding. The inner cylindrical surface of the washer 9′ is affixed to the upper portion of the outer cylindrical surface of the ceramic ring 8 in a manner whereby the upper surface of the substantially perpendicular part of said washer 9′ is spaced above the upper open end or base of said ceramic ring, so that the upper annular member 10′ supported by said perpendicular part at its upper surface, is spaced from said ceramic ring.

A lower annular member or washer 9 of substantially L-shaped cross-sectional area is affixed by suitable means such as hard solder to the lower portion of the outer cylindrical surface of the ceramic ring 8 and to the upper outside rim area surface of the lower annular member 10 by suitable means such as welding. The inner cylindrical surface of the washer 9 is affixed to the lower portion of the outer cylindrical surface of the ceramic ring 8 in a manner whereby the lower surface of the substantially perpendicular part of said washer 9 is spaced below the lower open end or base of said ceramic ring, so that the lower annular member 10, supported by said perpendicular part at its lower surface, is spaced from said ceramic ring.

Each of the upper and lower washers 9′ and 9 comprises an iron-cobalt-nickel alloy and each has a thickness, in the direction of the axis, of 0.5 mm. The innermost rim of each of the upper and lower annular members, which is inserted into the corresponding annular channel of the respective upper and lower central portions, is extending beyond the plane of the principal annular surface area of said upper and lower annular member in a manner whereby said upper and lower central portions are so positioned that their outer surfaces extend beyond the principal annular surface areas of said upper and lower annular members. Thus, the innermost rim of the upper annular member 10′ extends upward beyond the plane of the principal annular surface area of said upper annular member in a manner whereby the upper central portion 12′ supported thereby is positioned with its upper surface extending farther from the semiconductor device than said principal annular surface area of said upper annular member. The innermost rim of the lower annular member 10 extends downward beyond the plane of the principal annular surface area of said lower annular member in a manner whereby the lower central portion 12 supported thereby is positioned with its lower surface extending farther from the semiconductor device than said principal annular surface area of said lower annular member.

Each of the annular members 10 and 10′ is flexible under stress due to the channel 21 and 21′, respectively, formed therein. The annular members 10 and 10′ thus yield under stress or forces such as, for example, are caused by temperature changes during operation or outside influences acting on the insulator ring 8 in radial directions.

A silver foil 5, which is approximately .02 mm. thick, is preferably provided between the carrier body 4 and the upper central portion 12′ and a similar silver foil 7 is preferably provided between the carrier body 3 and the lower central portion 12. The silver foils provide a balance for thermal expansion of the upper and lower central portions and the corresponding carrier bodies, due to the slidable pressure contact thus provided between said central portions and said corresponding carrier bodies. The corresponding surfaces of the carrier bodies may be plated with silver or silver foil.

The semiconductor device 1 may be centered in axial position in the housing structure by centering pins 14 and 14′ positioned in bores 13 and 13′ formed in the upper surface of the lower central portion 12 and the lower surface of the upper central portion 12′, respectively. The pins extending from each central portion 12 and 12′ may be positioned, for example, at the apices of an equilateral triangle. The pins 14 and 14′ may be fastened in the corresponding bores 13 and 13′, respectively, by any suitable means. An evacuation nipple (not shown) may be affixed to one of the annular members 10 and 10′ by suitable means such as hard solder.

The semiconductor device 1 may be positioned in the housing structure by first hard soldering the annular members 9 and 9′ to the ceramic ring 8 in the aforedescribed manner and relation. The annular members 10 and 10′ are then hard soldered to the central portions 12 and 12′ in the aforedescribed manner and relation via the solder-containing channels 15 and 15′, respectively. The central portions 12 and 12′ usually have a larger thermal coefficient of expansion than the annular members 10 and 10′ so that the radial width of the channel 15 and of the channel 15′ is greater than the thickness of the innermost rim of each of the annular members 10 and 10′ which is soldered into such channel. The radial width of the channel is approximately twice the thickness of the innermost rim.

In affixing the central portions to the annular members, it is preferable to position such components so that the innermost rim of the annular member is adjacent the outermost cylindrical surface of the groove in the central portion into which the innermost rim of the annular member is inserted. This assures sufficient room for movement of the annular members 10 and 10′ in the channels 15 and 15′, respectively, when the central portions 12 and 12′ expand during the soldering process.

After the annular members 10 and 10′ are soldered to the central portions 12 and 12′, respectively, the lower surface of the upper central portion 12′ and the upper surface of the lower central portion 12 are lapped and, if centering pins 14 are to be utilized, bores are provided in such surfaces for such pins. The semiconductor device 1 and the silver foils 5 and 7 are positioned between the central portions 12 and 12′ in centered position and the annular members 10 and 10′ are welded to the annular members 9 and 9′, respectively.

Figure 2:
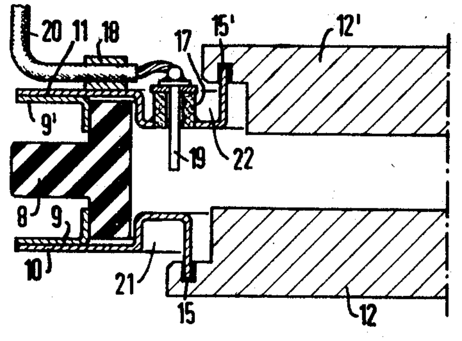
FIG. 2 is a sectional view of a modification of the embodiment of FIG. 1 housing a disc-shaped semiconductor thyristor.

FIG. 2 shows part of a modification of the embodiment of FIG. 1 which is for housing a thyristor. The same components of FIGS. 1 and 2 are identified by the same reference numerals. In the modification of FIG. 2, the upper annular member 10′ of FIG. 1 is replaced by an upper annular member 11. The annular member 11 is similar to the annular member 10 except that the radial width of the fluted annular section, groove or channel 22 formed therein at its inner rim is greater than the radial width of the fluted annular section, groove or channel 21 of the annular member 10. The innermost rim of the upper annular member 11 is thus of cylindrical configuration having a smaller diameter than the innermost rim of the lower annular member 10. Thus, the step rim diameter and the outer rim diameter of the upper central portion 12′ are greater than the corresponding diameters of the lower central portion 12.

A substantially cylindrical body of insulating material 17 such as, for example, ceramic material, passes through an aperture formed through the annular member 11 in the groove 22 and may be affixed thereto by hard solder. A central bore is provided through the cylindrical body 17 and an electrically conductive pin 19 is positioned in said bore with its lower part in the space between the central portions 12 and 12′ and with a disc-type head affixed to its upper part and resting on the upper surface of the cylindrical body. The pin head may be hard soldered to the cylindrical insulator 17 and the pin may comprise an iron-cobalt-nickel alloy. An electrical conductor 20 is electrically connected to the pin 19 at its upper part and is held in position by a clamp 18 affixed to the upper surface of the upper annular member 11 by suitable means such as hard solder. The pin 19 electrically contacts the control electrode of a thyristor (not shown) positioned in the housing of FIG. 2. A silver connector (not shown) may be utilized to electrically connect the pin 19 and the control electrode of the thyristor.

The semiconductor device 1 may be positioned in a frame (not shown) and tightly enclosed in the housing, a suitable frame being disclosed in copending patent application Ser. No. 482,460, filed Aug. 25, 1965, and assigned to the assignee of the present invention. Such a frame fits snugly within the inside cylindrical surface of the insulator ring 8. Any suitable positioning arrangement may be utilized to maintain the frame in position.

The semiconductor device 1 may be positioned in the housing structure of FIG. 2 by first positioning said semiconductor device in a frame, if a frame is to be utilized. The annular members 9, 9' and 10 and 11 are then hard soldered in the same manner as in the embodiment of FIG. 1 to the appropriate components. The lower surface of the upper central portion 12' and the upper surface of the lower central portion 12 are lapped. The semiconductor device 1, in the frame, if such is utilized, is then positioned on the upper central portion 12' and any positioning arrangement for the frame is engaged. The pin 19 is placed in contact with the control electrode of the thyristor semiconductor device 1. The ceramic ring 8 is then positioned on and around the frame and the lower central portion 12 is affixed by hard solder to the lower annular member 10. The annular members 11 and 10 are then welded to the upper and lower annular members 9' and 9, respectively.

Figure 3:
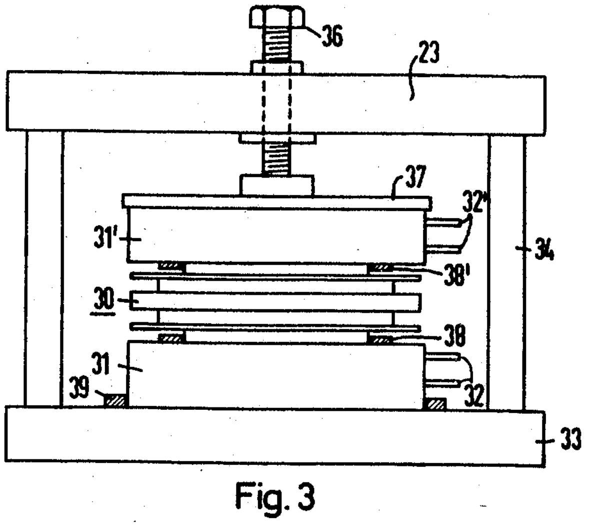
FIG. 3 is a view of a housing structure of the present invention in a clamping device between two cooling bodies.

FIG. 3 shows a housing structure of the present invention in a clamping device. In FIG. 3, the semiconductor device 30 is positioned between two cooling bodies 31 and 31'. Each of the cooling bodies 31 and 31' may comprise, for example, copper. Each of the cooling bodies 31 and 31' has inlet and outlet ducts for cooling fluid and electrical terminals. Thus, the upper cooling body 31' has inlet and outlet ducts 32' for cooling fluid, and electrical terminals (not shown), and the lower cooling body 31 has inlet and outlet ducts 32 for cooling fluid, and electrical terminals (not shown).

The clamping device comprises a base plate 33, an upper plate 23 and connecting members 34 between said base plate and said upper plate, all comprising steel. A tightening bolt or threaded member 36 is threadedly engaged and positioned in an aperture formed through the upper plate 23 and abuts at its lower end against a clamping disc 37 which is electrically insulated and is positioned on the upper surface of the upper cooling body 31'. A centering ring 38' may be affixed to the lower surface of the upper cooling body 31', and a centering ring 38 may be affixed to the upper surface of the lower cooling body 31 for centering the semiconductor device 30 in position. A centering ring 39 may be affixed to the upper surface of the base plate 33 for centering the lower cooling body 31.

While the invention has been described by means of specific examples and in specific embodiments, I do not wish to be limited thereto, for obvious modifications will occur to those skilled in the art without departing from the spirit and scope of the invention.

I claim:

1. A housing structure for a disc-shaped semiconductor device having a control electrode, comprising a substantially cylindrical section of insulation material, said cylindrical section being hollow and having spaced opposite open end bases;

a first end member affixed to one open end base of said cylindrical section and closing the one open end thereof, said first end member comprising a first central portion of substantially thick disc configuration and a first outer portion of substantially annular configuration having an inner rim affixed to said first central portion, said first central portion comprising a metal of good thermal and electrical conductivity and said first outer portion having a thickness considerably less than the thickness of said first central portion, and a fluted annular section formed in said first outer portion at its inner rim;

a second end member affixed to the other open end base of said cylindrical section and closing the other open end thereof, said second end member comprising a second central portion of substantially thick disc configuration and a second outer portion of substantially annular configuration having an inner rim affixed to said second central portion, said second central portion comprising a metal of good thermal and electrical conductivity and said second outer portion having a thickness considerably less than the thickness of said second central portion, and a fluted annular section formed in said second outer portion at its inner rim;

insulating means mounted on one of said first and second outer portions, said insulating means having a bore formed therethrough into said housing structure, electrical conducting means inserted in said bore and connected to said control electrode, electrical conducting means outside said housing and connecting means connecting said electrical conducting means to each other; and mounting means mounting a disc-shaped semiconductor device in said cylindrical section between said first and second end members.

2. A housing structure for a disc-shaped semiconductor device, comprising a substantially cylindrical section of insulation material, said cylindrical section being hollow and having spaced opposite open end bases;

a first end member affixed to one open end base of said cylindrical section and closing the one open end thereof, said first end member comprising a first central portion of substantially thick disc configuration and a first outer portion of substantially annular configuration having an inner rim affixed to said first central portion, said first central portion comprising a metal of good thermal and electrical conductivity and said first outer portion having a thickness considerably less than the thickness of said first central portion, and a fluted annular section formed in said first outer portion at its inner rim;

a second end member affixed to the other open end base of said cylindrical section and closing the other open end thereof, said second end member comprising a second central portion of substantially thick disc configuration and a second outer portion of substantially annular configuration having an inner rim affixed to said second central portion, said second central portion comprising a metal of good thermal and electrical conductivity and said second outer portion having a thickness considerably less than the thickness of said second central portion, and a fluted annular section formed in said second outer portion at its inner rim, each of said first and second central portions having a first principal surface substantially adjacent said semiconductor device, a second principal surface spaced from and substantially parallel to said first principal surface, a substantially annular mid-surface, a substantially cylindrical step surface substantially perpendicular to and joining said first and mid-surfaces and a substantially cylindrical outer peripheral surface substantially perpendicular to and joining said second and mid-surfaces, an annular groove formed in the mid-surface of each of said first and second central portions, fastening means for fastening the inner rim of the fluted annular section of said first outer portion in the annular groove formed in the mid-surface of said first central portion and fastening means for fastening the inner rim of the fluted annular section of said second outer portion in the annular groove formed in the mid-surface of said second central portion; and mounting means mounting a disc-shaped semiconductor device in said cylindrical section between said first and second end members.

3. A housing structure as claimed in claim 2, further comprising positioning pins extending from the first principal surface of each of said first and second central portions centrally positioning said semiconductor device.

4. A housing structure as claimed in claim 2, further comprising first linking means affixed to the other cylindrical surface of said cylindrical section for supporting said first end member in spaced relation to said one open end base of said cylindrical section and second linking means affixed to the outer cylindrical surface of said cylindrical section for supporting said second end member in spaced relation to said other open end base of said cylindrical section.

5. A housing structure as claimed in claim 4, wherein each of said first and second linking means is of substantially L-shaped cross-sectional area and comprises a material having a thermal coefficient of expansion similar to that of said cylindrical section.

6. A housing structure as claimed in claim 5, wherein said first outer portion of said first end member is affixed to said first linking means and said second outer portion of said second end member is affixed to said second linking means.

7. A housing structure for a disc-shaped semiconductor device, comprising a substantially cylindrical section of insulation material, said cylindrical section being hollow and having spaced opposite open end bases;

a first end member affixed to one open end base of said cylindrical section and closing the one open end thereof, said first end member comprising a first central portion of substantially thick disc configuration and a first outer portion of substantially annular configuration having an inner rim affixed to said first central portion, said first central portion comprising one of the metals copper or silver and said first outer portion comprising an iron-cobalt-nickel alloy and having a thickness considerably less than the thickness of said first central portion, and a fluted annular section formed in said first outer portion at its inner rim;

a second end member affixed to the other open end base of said cylindrical section and closing the other open end thereof, said second end member comprising a second central portion of substantially thick disc configuration and a second outer portion of substantially annular configuration having an inner rim affixed to said second central portion, said second central portion comprising one of the metals copper or silver and said second outer portion comprising an iron-cobalt-nickel alloy and having a thickness considerably less than the thickness of said second central portion, and a fluted annular section formed in said second outer portion at its inner rim;

mounting means mounting a disc-shaped semiconductor device in said cylindrical section between said first and second end members;

a molybdenum carrier plate positioned on one side of said semiconductor device; and silver foil positioned between said carrier plate and the corresponding one of said first and second central portions.

8. A housing structure for a disc-shaped semiconductor device, comprising a substantially cylindrical section of insulation material, said cylindrical section being hollow and having spaced opposite open end bases;

a first end member affixed to one open end base of said cylindrical section and closing the one open end thereof, said first end member comprising a first central portion of substantially thick disc configuration and a first outer portion of substantially annular configuration having an inner rim affixed to said first central portion, said first central portion comprising one of the metals copper or silver and said first outer portion comprising an iron-cobalt-nickel alloy and having a thickness considerably less than the thickness of said first central portion, and a fluted annular section formed in said first outer portion at its inner rim, at least one of said first and second central portions being silver plated;

a second end member affixed to the other open end base of said cylindrical section and closing the other open end thereof, said second end member comprising a second central portion of substantially thick disc configuration and a second outer portion of substantially annular configuration having an inner rim affixed to said second central portion, said second central portion comprising one of the metals copper or silver and said second outer portion comprising an iron-cobalt-nickel alloy and having a thickness considerably less than the thickness of said second central portion, and a fluted annular section formed in said second outer portion at its inner rim; and mounting means mounting a disc-shaped semiconductor device in said cylindrical section between said first and second end members.

References Cited

UNITED STATES PATENTS

| | | |
|---|---|---|
| 2,066,856 | 1/1937 | Rose. |
| 3,238,425 | 1/1966 | Geyer. |
| 3,280,389 | 10/1966 | Martin. |
| 3,310,716 | 3/1967 | Emeis. |

LEWIS H. MYERS, Primary Examiner

D. A. TONE, Assistant Examiner

U.S. Cl. X.R.

317—234